US006664856B2

(12) United States Patent
Schaffer

(10) Patent No.: US 6,664,856 B2

(45) Date of Patent: Dec. 16, 2003

(54) CIRCUIT CONFIGURATION FOR SETTING THE OPERATING POINT OF A RADIOFREQUENCY TRANSISTOR AND AMPLIFIER CIRCUIT

(75) Inventor: Josef-Paul Schaffer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/236,886

(22) Filed: Sep. 6, 2002

(65) Prior Publication Data

US 2003/0038679 A1 Feb. 27, 2003

Related U.S. Application Data

(63) Continuation of application No. PCT/EP01/01008, filed on Jan. 31, 2001.

(30) Foreign Application Priority Data

Mar. 6, 2000 (EP) ........................................... 00104820

(51) Int. Cl.[7] .............................. H03F 3/04; H03G 3/10

(52) U.S. Cl. ........................................ 330/296; 330/285

(58) Field of Search .................................. 330/296, 285

(56) References Cited

U.S. PATENT DOCUMENTS 4,395,690 A * 7/1983 Parras ........................ 333/214
5,438,302 A * 8/1995 Goble ........................ 331/167
5,854,578 A 12/1998 Minasi et al.
5,900,782 A 5/1999 Igarashi et al.
6,178,313 B1 * 1/2001 Mages et al. ............ 455/127.2
6,218,904 B1 * 4/2001 Panther ...................... 330/296
2001/0052777 A1 * 12/2001 Belau et al.
2002/0183019 A1 * 12/2002 Dent et al.

FOREIGN PATENT DOCUMENTS

EP 0 116 982 A1 8/1984
GB 2 312 575 A 10/1997

OTHER PUBLICATIONS

Dieuleveult, F.: "Amplificateur de puissance 500mW, UHF" [Amplifier Having a 500 mW Output, UHF], Electronique Radio Plans, No. 558, May 1994, pp. 57–60.

Author not listed: "Active Bias Controller", Infineon Technologies, Feb. 24, 1999, pp. 1–7.

Author not listed: "Active Bias Controller", Infineon Technologies, Feb. 11, 2000, pp. 1–4.

Bellantoni, J. V.: "Low Dropout Current Source Protects Silicon MMICs and Transistors", RF Design, vol. 18, No. 8, Aug. 1, 1995, pp. 40, 42–44.

* cited by examiner

*Primary Examiner*—Patricia Nguyen

(74) *Attorney, Agent, or Firm*—Laurence A. Greenberg; Werner H. Stemer; Ralph E. Locher

(57) ABSTRACT

An amplifier circuit with a radiofrequency transistor has a circuit for setting the operating point. The setting circuit provides a base current for the radiofrequency transistor depending on the voltage drop across a resistor that is connected into the collector circuit of the radiofrequency transistor. The circuit has a differential element, which is fed by the supply voltage and compares the voltage drop across the resistor with a reference voltage. The base current is generated by a current source in dependence on the voltage difference. The circuit requires only a low supply voltage, with the result that the power consumed in the resistor is also low. The circuit can be implemented with a small number of components.

9 Claims, 2 Drawing Sheets

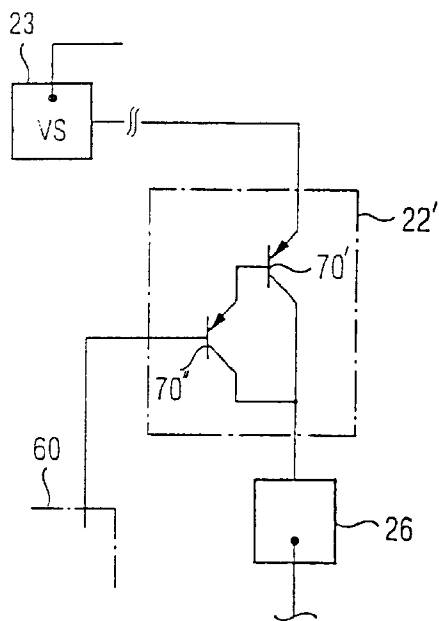
FIG 2A
FIG 1
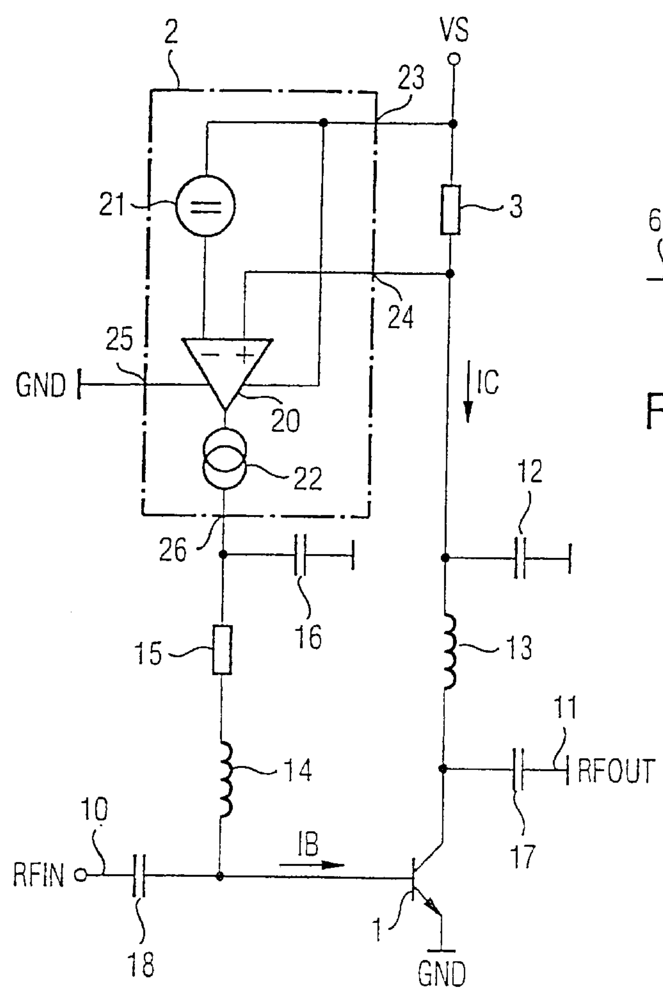

CIRCUIT CONFIGURATION FOR SETTING THE OPERATING POINT OF A RADIOFREQUENCY TRANSISTOR AND AMPLIFIER CIRCUIT

CROSS-REFERENCE TO RELATED APPLICATIONS

This application is a continuation of copending International Application No. PCT/EP01/01008, filed Jan. 31, 2001, which designated the United States and which was not published in English.

BACKGROUND OF THE INVENTION

Field of the Invention

The invention relates to a circuit configuration for setting the operating point of a radiofrequency transistor having terminals for supply potentials and also a terminal for a measuring resistor. The invention also relates to an amplifier circuit having a radiofrequency transistor and such a circuit configuration.

Amplifier circuits for radiofrequency signals have a radiofrequency transistor to which the signal to be amplified can be fed at a control input and in which the amplified signal is coupled out at the load circuit. The transistor is held at its operating point by direct current being suitably impressed at the control input and at the load current path.

Amplifier circuits with radiofrequency transistors have different gain properties depending on the supply current. Therefore, resistor networks or active circuits are employed in order to set the operating point of the amplifier transistor as far as possible independently of manufacturing tolerances thereof and the temperature response thereof.

A circuit configuration for setting the operating point for a radiofrequency transistor is, for example, the circuit BCR 400 of Infineon Technologies, as shown for example in the data sheet relating to the integrated circuit BCR 400W dated Feb. 24, 1999. The circuit has two terminals for a supply voltage and also a measurement terminal for connection of a measuring resistor and also a current output for connection to the base of a bipolar radiofrequency transistor. The external measuring resistor connected between measurement terminal and the positive pole of the supply voltage is connected into the collector current path of the radiofrequency transistor. The external measuring resistor has a value of 100 to 220 Ω. The voltage drop present across this external resistor has a value of approximately 600 mV. In apparatuses with a low supply voltage, in particular battery-operated apparatuses, this limits the maximum output power of the amplifier circuit. The operating time of a battery-operated apparatus is limited by the not inconsiderable current consumption at the measuring resistor.

The article by J. V. Bellantoni, "Low Dropout Current Source Protects Silicon MMICs and Transistors," RF Design, Cardiff Publishing Co., Englewood Colo., US, Vol. 18, No. 8, Aug. 1, 1995, pages 40, 42 to 44, shows an RF amplifier circuit in which a measuring resistor is connected to the collector terminal of a radio frequency transistor and a regulating circuit is coupled to the base terminal of the transistor. The regulating circuit has a first differential amplifier, which is connected to the measuring resistor, and also a current source, which, on the output side, is formed by a further differential amplifier and is driven by the first differential amplifier.

SUMMARY OF THE INVENTION

It is accordingly an object of the invention to provide a circuit configuration for setting the operating point of a radiofrequency transistor which overcomes the above-mentioned disadvantages of the heretofore-known devices and methods of this general type and which provides for a circuit that can operate at a low supply voltage and that has a low power consumption. It is a further object to specify an amplifier circuit having such a circuit configuration for setting the operating point.

With the foregoing and other objects in view there is provided, in accordance with the invention, a circuit configuration for setting an operating point of a radiofrequency transistor having a load current path and a control terminal, comprising:

- a terminal for a first supply potential and a terminal for a second supply potential;
- a measurement terminal for connection to a measuring resistor connected in series with the load current path of the radiofrequency transistor;
- an output terminal for connection to the control terminal of the radiofrequency transistor;
- a reference voltage source;
- a differential element having supply voltage terminals connected to the terminal for the first supply potential and to the terminal for the second supply potential, a first signal input connected to the reference voltage source, and a second signal input connected to the measurement terminal;
- a current source connected to and controllable by the differential element and connected to the output terminal;
- a first resistor connected to the terminal for the first supply potential and a second resistor connected to the terminal for the first supply potential;
- a current source connected to the terminal for the second supply potential;
- a current mirror circuit having an input path connected to the current source, an output path connected to the terminal for the first supply potential through the first resistor, and a control line coupling the input path to the output path;
- a transistor having a base connected to the control line and an emitter connected through the second resistor to the terminal for the first supply potential and to the measurement terminal.

According to the invention, the object relating to the circuit configuration for setting the operating point is achieved by means of a circuit configuration for setting the operating point of a radiofrequency transistor comprising: a terminal for a first supply potential and a terminal for a second supply potential; a measurement terminal, to which is to be connected a measuring resistor connected in series with the load current path of a radiofrequency transistor; an output terminal, to which a control terminal of the radiofrequency transistor is to be coupled; a differential element, which, in terms of supply voltage, is connected to the terminals for the first and second supply potentials and has a first signal input, which is connected to a reference voltage source, and a second signal input which is connected to the measurement terminal; and a current source which can be controlled by the differential element and is connected to the output terminal; a first current mirror circuit having an input path, which is connected to a current source connected to the terminal for the second supply potential, and having an output path, which is coupled to the input path via a control line and is connected to the terminal for the first supply potential via a first resistor; and a first transistor, whose base is connected to the control line connecting the paths of the first current mirror circuit, and whose emitter is connected via a second resistor to the terminal for the first supply potential and to the measurement terminal.

With the above and other objects in view there is also provided, in accordance with the invention, an amplifier circuit, comprising:

- an input terminal for a radiofrequency input signal and an output terminal for a radio frequency output signal;
- a circuit configuration as outlined above for setting the operating point of a radiofrequency transistor;
- a resistor connected between the terminal for the first supply potential and the measurement terminal of the circuit configuration; and
- a radiofrequency transistor having a collector DC-coupled to the measurement terminal and a base DC-coupled to the output terminal of the circuit configuration, the base being coupled to the input terminal for the radiofrequency input signal and the collector being coupled to the output terminal for the radio frequency output signal.

That is, the amplifier circuit having such a circuit configuration additionally has: a resistor, which is connected between the terminal for the first supply potential and the measurement terminal of the circuit configuration, and a radiofrequency transistor, whose collector is DC-coupled to the measurement terminal of the circuit configuration and whose base is DC-coupled to the output terminal of the circuit configuration, whose base is coupled to an input terminal for a radiofrequency input signal and whose collector is coupled to an output terminal for a radio frequency output signal.

The circuit configuration according to the invention has a differential element which is fed by the supply voltage and compares the voltage across the measuring resistor with a reference voltage. Depending on this, the current of a current source is controlled, which current source is to be connected to the control terminal of the radiofrequency transistor, for example the base terminal of a bipolar RF transistor. The difference formation makes is possible to provide a low reference voltage with which the voltage dropped across the external measuring resistor is to be compared. In practice, the reference voltage is approximately 100 mV. The difference between the two voltages controls the current output of the circuit.

A refinement of the invention provides a first current mirror circuit, whose input path is fed by a current source and in whose output path a resistor is connected across which the reference voltage is dropped. The control terminal of a first transistor is connected to the control line connecting the input and output branches of the first current mirror circuit. On the load current side, the measuring resistor is to be connected to the first transistor. The load current of the first transistor is controlled depending on the difference between the voltage across the measuring resistor and the reference voltage generated across the resistor in the first current mirror. An output transistor operated in a common-emitter configuration is driven, in terms of current, via a second current mirror. The load current of said output transistor or second transistor serves for impressing current into the control terminal of the radiofrequency transistor. Instead of a single output transistor, a Darlington circuit comprising at least two transistors is also suitable, which has a higher current driver capability.

The current source in the input branch of the first current mirror circuit is formed in a conventional manner. For this purpose, a transistor is provided whose load current path is connected to reference-ground potential via a resistor and whose control terminal is likewise connected to reference-ground potential via the series circuit of a plurality of diodes. A constant current can be tapped off at the other terminal of the load current path of this transistor.

The first current mirror is realized in a conventional manner by coupling control terminal and load current path of the transistor in the input branch. The control terminal of this transistor is additionally connected to the control terminal of the transistor in the output branch.

The transistors in the first current mirror are bipolar pnp transistors. Likewise, the second transistor forming the differential amplifier and also the current source transistor on the output side are bipolar pnp transistors. The circuit configuration can be realized with MOS transistors instead of bipolar transistors. In this case, npn transistors are to be replaced by n-channel MOS transistors and pnp transistors by p-channel MOS transistors.

The circuit according to the invention has the advantage that only relatively few components are required. The low complexity means that the circuit fits into a small, cost-effective standard housing. The current regulation of the circuit commences at an operating voltage as low as about 2 volts. The signals in the regulating circuit have no phase shift, with the result that the regulation has a high stability. The temperature response of the circuit behaves oppositely to the temperature response of a bipolar amplifier transistor, with the result that overall the amplifier circuit has a largely temperature-stable gain behavior.

Other features which are considered as characteristic for the invention are set forth in the appended claims.

Although the invention is illustrated and described herein as embodied in a circuit configuration for setting the operating point of a radiofrequency transistor and amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of the amplifier circuit including a circuit configuration for setting the operating point which is implemented in an integrated circuit;

FIG. 2A shows a detail of the circuit of FIG. 2 with an alternative embodiment of the current source.

DESCRIPTION OF THE PREFERRED EMBODIMENTS

Figure 2:
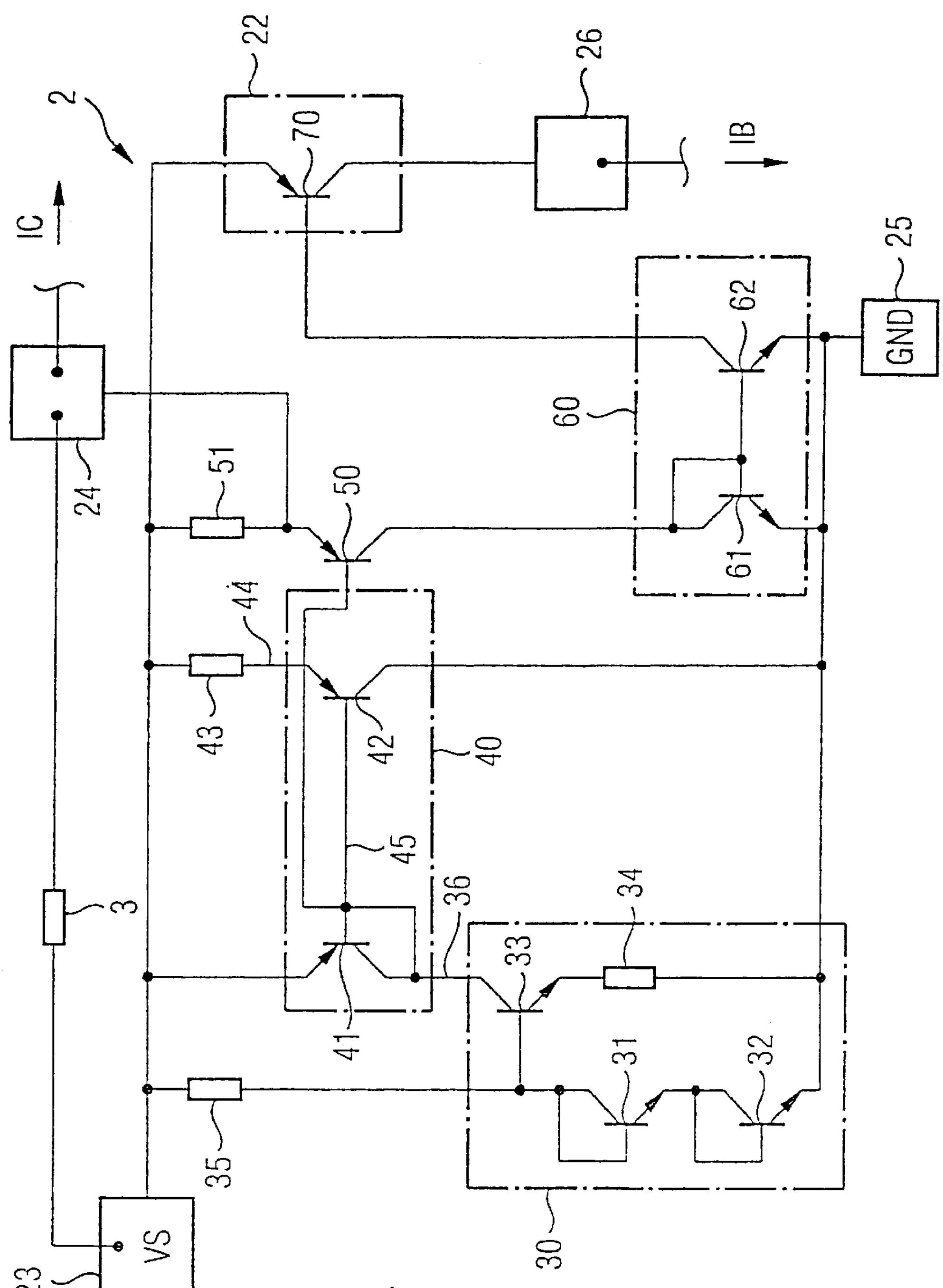
FIG. 2 is a diagram of the implementation of the circuit configuration for setting the operating point at the transistor level.

Referring now to the figures of the drawing in detail and first, particularly, to FIG. 1 thereof, there is shown an amplifier circuit with a bipolar npn radiofrequency transistor 1, whose base terminal is connected to an input terminal 10 for the radiofrequency signal RFIN to be amplified. The transistor 1 has a collector terminal connected to a positive supply potential VS via a resistor 3 for setting the operating point. The emitter of the transistor 1 is connected to reference-ground potential (ground) GND. The radiofrequency output signal RFOUT can be tapped off at an output terminal 11 connected to the collector of the transistor 1. A circuit configuration 2 for operating-point setting has an output 26, which carries an impressed current which couples into the base of the transistor 1. The operating point of the transistor 1 is set by supplying the transistor 1 with a collector current IC set by the resistor 3 and with a base current IB adapted thereto. A respective blocking capacitor 18 and 17 assigned to the terminals 10 and 11 serves for blocking the direct currents IB and IC, respectively, from the input and output terminals. Furthermore, an inductor 13 is provided in the load or collector current path and an inductor 14 in series with a resistor 15 is provided in the base current feed, and a respective capacitor 12 and 16 connected to ground is provided, in order to decouple the radiofrequency signal to be amplified from the DC feed.

The operating-point setting circuit 2 has a terminal 23 for the positive supply potential VS, a terminal 24, to which the measuring resistor 3 of the collector current path of the amplifier transistor 1 is connected, and a terminal 25 for reference-ground potential GND. The impressed base current which is regulated depending on the supply voltage VS, GND and the current flowing through the measuring resistor 3 can be tapped off at a terminal 26. The circuit 2 has a differential element 20, which is fed by the supply voltage VS, GND. The inverting input of the differential element 20 is connected to a reference voltage source 21, which is connected to the terminal 23 for the supply potential VS. The noninverting input of the differential element 20 is connected to the terminal 24 and taps off the voltage dropped across the measuring resistor 3. A current source 22 is controlled depending on the voltage difference determined by the differential element 20, which current source provides the base current IB at the terminal 26.

The embodiment of the circuit configuration 2 is illustrated in detail in FIG. 2. Corresponding elements are provided with identical reference symbols. The circuit has a current source 30, which is connected to the reference-ground potential terminal 25 and, on the output side, provides a constant current at a terminal 26. The current source comprises a bipolar transistor 33, whose emitter is connected to the reference-ground potential terminal 25 via a resistor 34. The base of the transistor 33 is connected to the reference-ground potential terminal 25 via two series-connected bipolar diodes 31, 32. Via a resistor 35, a current is fed from the terminal 23 for the positive supply potential VS to the series circuit of diodes 31, 32. The constant current supplied at the terminal 36 of the current source 30 is coupled into the input branch of a current mirror circuit 40. On the input side, the current mirror circuit 40 comprises a bipolar transistor 41, whose collector and base are connected to one another. The collector terminal of the transistor 41 is connected to the current source 30, and the emitter terminal is connected to the terminal 23 for the positive supply potential VS. The output branch of the current mirror 40 contains a bipolar transistor 42, whose collector is directly connected to the reference-ground potential terminal 25 and whose emitter is connected to the supply potential terminal 23 via a resistor 43. The transistor 42 can carry a higher current compared with the transistor 41. It is embodied as a multi-emitter transistor or as a parallel circuit comprising a plurality of transistors. On the base side, the transistor 42 is connected to the base of the transistor 41. The constant current supplied by the current source 36 is provided to the resistor 43 in a manner correspondingly amplified via the current mirror 40, so that a constant voltage related to the positive supply potential VS is established at the current-mirror-side terminal 44 of the resistor 43.

A further bipolar transistor 50 has, on the emitter side, a resistor 51 connected to the supply potential terminal 23. The base of the transistor 50 is connected to the connecting line 45 between the transistors 41, 42—forming the input and output branches—of the current mirror 40, that is to say the connecting line of the base terminals of the transistors 41, 42. The emitter of the transistor 50 is additionally connected to the terminal 24, to which is connected the measuring resistor 3 for the collector current of the radiofrequency amplifier transistor 1. The transistor 50 is thus operated in a common-base configuration. The base-emitter voltage of the transistor 50 and thus the collector current thereof are influenced depending on the current flowing through the measuring resistor 3. Specifically, the voltage dropped across the measuring resistor 3 is compared with the constant voltage present at the circuit node 44 or across resistor 43 and the collector current of the bipolar transistor 50 is set depending on the voltage difference between the voltage dropped across the resistor 3 and the constant voltage across the resistor 43. The collector current of the transistor 50 is mirrored via a current mirror 60 connected to the reference-ground potential terminal 25 and is fed to the base terminal of a bipolar transistor 70 forming the current source 22. The current mirror 60 comprises, on the input side, a transistor 61 with coupled collector and base terminals and, on the output side, a transistor 62, whose base is connected to the base of the transistor 61. The collector of the transistor 62 is connected to the base of the transistor 70. The current is expediently amplified, for example doubled, between the input and output paths of the current mirror 60 by the transistor 62 being embodied as a double-emitter transistor. The emitter of the transistor 70 is at the potential VS, that is to say the transistor 70 is operated in a common-emitter configuration.

As an alternative to a single transistor 70, it is also possible to form the current source 22 as a Darlington circuit. With reference to FIG. 2A, the Darlington circuit 22' comprises two or more transistors (70', 70") forming the current source 22. The Darlington circuit has a higher current driver capability compared with a single transistor. In the case of the Darlington circuit formed from two pnp transistors, the emitter terminal of the first Darlington transistor 70' is connected to the terminal 23. The emitter of the second Darlington transistor 70" is connected to the base of the first Darlington transistor 70'. The base of the second Darlington transistor 70" is connected to the output branch of the current mirror 60. The collector terminals of the Darlington transistors are connected to one another and are connected to the output terminal 26.

Thus, by means of the circuit configuration for setting the operating point for the radiofrequency transistor 1, a constant voltage is generated depending on a constant current—provided on account of the current source 30—at the resistor 43, and, moreover, through difference formation by means of the transistors 42, 50—coupled at their base terminals—with the measurement voltage coupled in at the transistor 50, a collector current of the transistor 50 is generated which is dependent on this difference and is provided, after mirroring and amplification, as output current at the terminal 26.

The transistors 31, 32, 33 of the current source 30 and also the transistors 61, 62 of the current mirror 60 are npn bipolar transistors. The transistors 41, 42 of the current mirror 40 and also the transistor 50 and the current source transistor 22 are pnp bipolar transistors. The load current path of each of the npn and pnp transistors is its collector-emitter current path. The control terminal of each transistor is its base terminal. The embodiment described enables operation at a low voltage. The regulation already commences at an operating voltage VS, GND of 2 V. The circuit has a manageable number of transistors and resistors which require only a small amount of silicon area in the case of an integrated realization. The monolithic integrated circuit can readily be accommodated in a small standard 4-pin housing.

Instead of the realization using a bipolar semiconductor technology as shown, the circuit can also be realized using MOS technology. n-channel MOS transistors can be used instead of the bipolar transistors 31, 32, 33, 61, 62 shown. p-channel MOS transistors can be used instead of the pnp bipolar transistors 41, 42, 50, 22 shown. The load current paths of the MOS transistors are their drain-source paths. the control electrodes of the MOS transistors are their gate electrodes.

As is known, the voltage dropped across the base-emitter junction of a bipolar transistor is temperature-dependent. As the temperature rises, the base-emitter voltage decreases. For a rising temperature, the voltage difference dropped across the base-emitter junction of the transistor 50 has a negative coefficient, with the result that the base current provided at the terminal 26 likewise has a negative temperature coefficient. This limits the collector current of the bipolar radiofrequency amplifier transistor 1. The temperature response of the circuit 2 has an opposite profile to the temperature response of the transistor 1, with the result that the operating point of the transistor 1 remains temperature-stable.

I claim:

1. A circuit configuration for setting an operating point of a radiofrequency transistor having a load current path and a control terminal, comprising:

a terminal for a first supply potential and a terminal for a second supply potential;

a measurement terminal for connection to a measuring resistor connected in series with the load current path of the radiofrequency transistor;

an output terminal for connection to the control terminal of the radiofrequency transistor;

a reference voltage source;

a differential element having supply voltage terminals connected to said terminal for said first supply potential and to said terminal for said second supply potential, a first signal input connected to said reference voltage source, and a second signal input connected to said measurement terminal;

a current source connected to and controllable by said differential element and connected to said output terminal;

a first resistor connected to said terminal for the first supply potential and a second resistor connected to said terminal for the first supply potential;

a current source connected to said terminal for the second supply potential;

a current mirror circuit having an input path connected to said current source, an output path connected to said terminal for the first supply potential through said first resistor, and a control line coupling said input path to said output path;

a transistor having a base connected to said control line and an emitter connected through said second resistor to said terminal for the first supply potential and to said measurement terminal.

2. The circuit configuration according to claim 1, wherein said transistor is a first transistor and said current mirror circuit is a first current mirror, and which further comprises a second current mirror and a common-emitter second transistor having a base connected to said first transistor via said second current mirror and a collector connected to said output terminal.

3. The circuit configuration according to claim 1, wherein said current source includes a further transistor having a load current path connected between said input path of said first current mirror and a resistor connected to said terminal for the second supply potential, and wherein said further transistor has a control terminal connected to said terminal for the second supply potential via a series circuit comprising at least two diodes.

4. The circuit configuration according to claim 1, wherein said transistor is a first transistor, and wherein said input path of said first current mirror includes a second transistor having a load path forming said input path and having a control terminal coupled to the load path, and wherein said output path of said first current mirror includes a third transistor having a load path forming said output path and having a control terminal coupled to said control terminal of said second transistor forming said input path.

5. The circuit configuration according to claim 4, wherein said second current mirror has a fourth transistor with a load current path coupled to the load current path of said first transistor and a control terminal coupled to said load current path thereof, and a fifth transistor having a load current path connected to said current source, and wherein said control terminals of said fourth and fifth transistors of said second current mirror are coupled to one another.

6. The circuit configuration according to claim 4, wherein said second and third transistors of said first current mirror are transistors selected from the group consisting of pnp transistors and n-channel MOS transistors.

7. The circuit configuration according to claim 2, wherein the first and second transistors are transistors selected from the group consisting of pnp transistors and p-channel MOS transistors.

8. The circuit configuration according to claim 1, wherein said current source is a Darlington circuit with at least two transistors.

9. An amplifier circuit, comprising:

an input terminal for a radiofrequency input signal and an output terminal for a radio frequency output signal;

a circuit configuration according to claim 1;

a resistor connected between said terminal for the first supply potential and said measurement terminal of said circuit configuration;

a radiofrequency transistor having a collector DC-coupled to said measurement terminal and a base DC-coupled to said output terminal of said circuit configuration, said base being coupled to said input terminal for the radiofrequency input signal and said collector being coupled to said output terminal for the radio frequency output signal.

* * * * *